United States Patent
Kwak et al.

(10) Patent No.: US 8,552,776 B2
(45) Date of Patent: Oct. 8, 2013

(54) APPARATUSES AND METHODS FOR ALTERING A FORWARD PATH DELAY OF A SIGNAL PATH

(75) Inventors: Jongtae Kwak, Boise, ID (US); Kallol Mazumder, Plano, TX (US)

(73) Assignee: Micron Technology, Inc., Boise, ID (US)

( * ) Notice: Subject to any disclaimer, the term of this patent is extended or adjusted under 35 U.S.C. 154(b) by 63 days.

(21) Appl. No.: 13/364,198

(22) Filed: Feb. 1, 2012

(65) Prior Publication Data

US 2013/0194013 A1    Aug. 1, 2013

(51) Int. Cl.
*H03L 7/00*    (2006.01)

(52) U.S. Cl.
USPC .......................................... 327/161; 327/261

(58) Field of Classification Search
None
See application file for complete search history.

(56) References Cited

U.S. PATENT DOCUMENTS

| | | | |
|---|---|---|---|
| 6,219,384 B1 * | 4/2001 | Kliza et al. ..................... | 375/258 |
| 6,260,128 B1 | 7/2001 | Ohshima et al. | |
| 6,438,055 B1 | 8/2002 | Taguchi et al. | |
| 6,510,095 B1 | 1/2003 | Matsuzaki et al. | |
| 6,687,185 B1 | 2/2004 | Keeth et al. | |
| 6,744,285 B2 | 6/2004 | Mangum et al. | |
| 6,973,008 B2 | 12/2005 | Krause | |
| 6,980,479 B2 | 12/2005 | Park | |
| 6,988,218 B2 | 1/2006 | Drexler | |
| 7,042,799 B2 | 5/2006 | Cho | |
| 7,058,799 B2 | 6/2006 | Johnson | |
| 7,111,185 B2 | 9/2006 | Gomm et al. | |
| 7,170,819 B2 | 1/2007 | Szczypinski | |
| 7,187,599 B2 | 3/2007 | Schnell et al. | |
| 7,209,396 B2 | 4/2007 | Schnell | |
| 7,269,754 B2 | 9/2007 | Ramaswamy et al. | |
| 7,280,430 B2 | 10/2007 | Lee | |
| 7,340,632 B2 | 3/2008 | Park | |
| 7,375,560 B2 | 5/2008 | Lee et al. | |
| 7,411,852 B2 | 8/2008 | Nishioka et al. | |
| 7,443,216 B2 | 10/2008 | Gomm et al. | |
| 7,451,338 B2 | 11/2008 | Lemos | |
| 7,631,248 B2 | 12/2009 | Zakharchenko et al. | |
| 7,656,745 B2 | 2/2010 | Kwak | |
| 7,660,187 B2 | 2/2010 | Johnson et al. | |
| 7,663,946 B2 | 2/2010 | Kim | |
| 7,671,648 B2 * | 3/2010 | Kwak ........................... | 327/158 |
| 7,715,260 B1 | 5/2010 | Kuo et al. | |
| 7,716,510 B2 | 5/2010 | Kwak | |
| 7,751,261 B2 | 7/2010 | Cho | |
| 7,773,435 B2 | 8/2010 | Cho | |

(Continued)

OTHER PUBLICATIONS

Related U.S. Appl. No. 13/592,244, filed Aug. 22, 2012.

(Continued)

*Primary Examiner* — Cassandra Cox
(74) *Attorney, Agent, or Firm* — Dorsey & Whitney LLP (57) ABSTRACT

Apparatuses and methods related to altering the timing of command signals for executing commands is disclosed. One such method includes calculating a forward path delay of a clock circuit in terms of a number of clock cycles of an output clock signal provided by the clock circuit and adding a number of additional clock cycles of delay to a forward path delay of a signal path. The forward path delay of the clock circuit is representative of the forward path delay of the signal path and the number of additional clock cycles is based at least in part on the number of clock cycles of forward path delay.

27 Claims, 6 Drawing Sheets

(56) References Cited

U.S. PATENT DOCUMENTS

| | | |
|---|---|---|
| 7,826,305 B2 | 11/2010 | Fujisawa |
| 7,872,924 B2 | 1/2011 | Ma |
| 7,913,103 B2 | 3/2011 | Gold et al. |
| 7,945,800 B2 | 5/2011 | Gomm et al. |
| 7,948,817 B2 | 5/2011 | Coteus et al. |
| 7,969,813 B2 | 6/2011 | Bringivijayaraghavan et al. |
| 2001/0015924 A1 | 8/2001 | Arimoto et al. |
| 2003/0117864 A1 | 6/2003 | Hampel et al. |
| 2006/0155948 A1 | 7/2006 | Ruckerbauer |
| 2007/0033427 A1 | 2/2007 | Correale, Jr. et al. |
| 2007/0088903 A1 | 4/2007 | Choi |
| 2008/0080271 A1 | 4/2008 | Kim |
| 2009/0315600 A1 | 12/2009 | Becker et al. |
| 2010/0001762 A1 | 1/2010 | Kim |
| 2010/0165769 A1 | 7/2010 | Kuroki |
| 2010/0165780 A1 | 7/2010 | Bains et al. |
| 2010/0195429 A1 | 8/2010 | Sonoda |
| 2010/0254198 A1 | 10/2010 | Bringivijayaraghavan et al. |
| 2011/0055671 A1 | 3/2011 | Kim et al. |
| 2011/0228625 A1 | 9/2011 | Bringivijayaraghavan |
| 2011/0238941 A1 | 9/2011 | Xu et al. |

OTHER PUBLICATIONS

Related U.S. Appl. No. 13/074,972, filed Mar. 29, 2011.
Related U.S. Appl. No. 13/093,640, filed Apr. 25, 2011.
Related U.S. Appl. No. 13/486,674, filed Jun. 1, 2012.
Related U.S. Appl. No. 13/531,341, filed Jun. 22, 2012.
Related U.S. Appl. No. 13/543,698, filed Jul. 6, 2012.
Notificiation of International Search Report and Written Opinion dated May 7, 2012 for International Application No. PCT/US2012/027672, May 7, 2012, 1-9.
"Interfacing DDR SDRAM with Stratix II Devices", Version 3.2, Altera Corp, Sep. 2008.
Lee, "How to Implement DDR SGRAM in Graphic System", Samsung Electric, 1998.

\* cited by examiner

APPARATUSES AND METHODS FOR ALTERING A FORWARD PATH DELAY OF A SIGNAL PATH

TECHNICAL FIELD

Embodiments of the invention relate generally to semiconductor memory, and more specifically, in one or more described embodiments, to signal paths and altering the timing of command signals for executing commands in a memory.

BACKGROUND OF THE INVENTION

In semiconductor memory, proper operation of the memory is based on the correct timing of various internal command and clock signals. For example, in reading data from the memory, internal clock signals that clock data block circuitry to provide (e.g. output) the read data may need to be provided substantially concurrently with internal read command signals to properly enable the data block circuitry to output the read data. If the timing of the internal read command signal is not such that the data block circuitry is enabled at the time the internal clock signal clocks the data block circuitry to output the read data at an expected time, the read command may be inadvertently ignored or the read data provided by the memory may not be correct (i.e., the data associated with another read command). Likewise, in writing data to memory internal clock signals that clock data path circuitry to latch write data may need to be provided with specific timing relationships with internal write command signals to properly enable the data path circuitry to provide the latched write data for writing to memory. Inaccurate timing of the internal command and clock signals could result in the write command being inadvertently ignored or incorrect write data being provided to the memory may (e.g., the write data is associated with another write command). Another example of a command that may require the correct timing of internal clock signals and the command for proper operation include, for example, on-die termination enable commands.

Moreover, as known, a "latency" may be programmed to set a time, typically in numbers of clock periods tCK, between receipt of a read command by the memory and when the data is output by the memory. A "write latency" may also be programmed to set a time, also typically in numbers of tCK, between receipt of a write command by the memory and when the write data is provided to the memory. The latencies may be programmed by a user of the memory to accommodate clock signals of different frequencies (i.e., different clock periods).

Complicating the generating of correctly timed internal clock and command signals is the relatively high frequency of memory clock signals. For example, memory clock signals can exceed 1 GHz. Further complicating the matter is that multi-data rate memories may provide and receive data at a rate higher than the memory clock signal, which may represent the rate at which commands may be executed. As a result, the timing domains of command and clock signals may need to be crossed in order to maintain proper timing. An example of a multi-data rate memory is one that outputs read data at a rate twice that of the clock frequency, such as outputting data synchronized with clock edges of the memory clock signal.

An example conventional approach of timing internal command and clock signals is modeling both the clock path and the command path to have the same propagation delay. This may require, however, that delays and/or counter circuitry run continuously. As a result, power consumption may be higher than desirable. Additionally, the propagation delay of the various internal clock and command paths can often vary due to power, voltage, and temperature conditions. For clock and command paths having relatively long propagation delay or additional delay circuitry, the variations due to operating conditions may negatively affect the timing of the internal signals to such a degree that the memory does not operate properly.

DETAILED DESCRIPTION

Certain details are set forth below to provide a sufficient understanding of embodiments of the invention. However, it will be clear to one skilled in the art that embodiments of the invention may be practiced without these particular details. Moreover, the particular embodiments of the present invention described herein are provided by way of example and should not be used to limit the scope of the invention to these particular embodiments. In other instances, well-known circuits, control signals, timing protocols, and software operations have not been shown in detail in order to avoid unnecessarily obscuring the invention.

Figure 1:
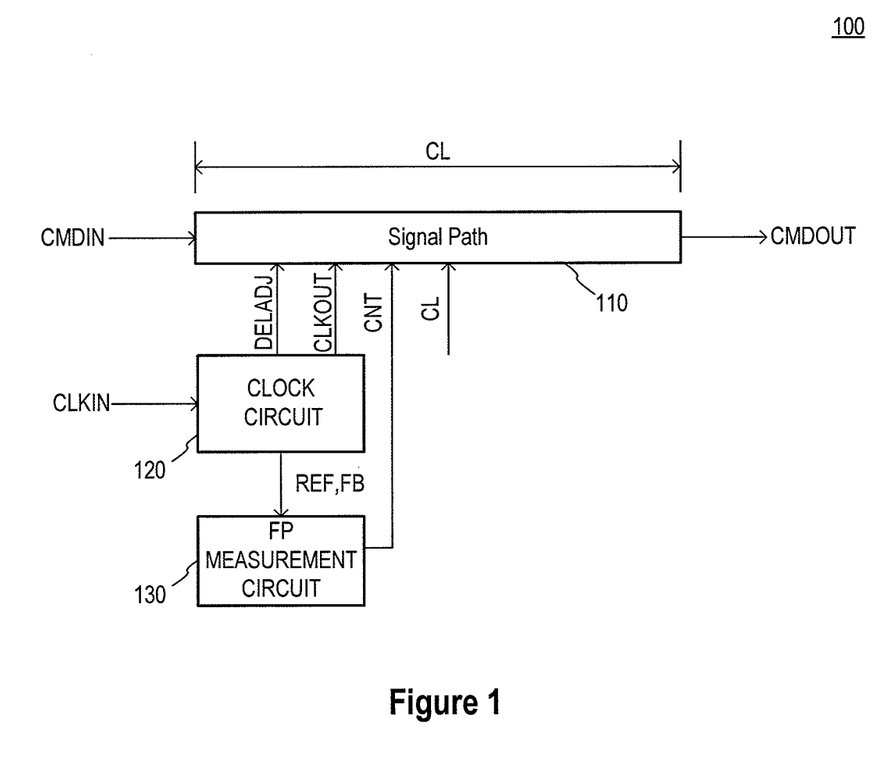
FIG. 1 is a block diagram of an apparatus according to an embodiment of the invention.

FIG. 1 illustrates an apparatus according to an embodiment of the invention.

The apparatus includes a signal path 110, clock circuit 120, and forward path measurement circuit 130. The signal path 110 is configured to receive a signal, for example, a command signal CMDIN as shown in FIG. 1, and propagate the CMDIN signal to an output signal, such as output command signal CMDOUT. The CMDIN signal may represent a memory command, for example, a read command, write command, or other memory command, and may include one or several signals. The signal path 110 should have a propagation delay to satisfy a CAS latency CL. In this manner, a CMDIN signal may be propagated to a circuit that may, for example, be enabled by the resulting CMDOUT signal at an appropriate time according to the CL. The signal path 110 may include an adjustable delay circuit to provide an adjustable delay (not shown) to the propagation delay of the signal path 110. The signal path 110 may further include a shift circuit (not shown) to provide additional clock cycles of time in order to have a propagation delay to satisfy the CL. The clock circuit 120 is configured to provide a clock signal CLKOUT having a delayed phase relationship to an input clock signal CLKIN. The delay added to the CLKIN signal is adjustable and adjusted to be an amount suitable to substantially synchronize an operation to the CLKIN signal. The CLKOUT signal is provided to the signal path 110, as well as a delay adjustment signal DELADJ. The DELADJ signal may result from determining a suitable amount of delay to add to the CLKIN signal and may be used to adjust a delay of an adjustable delay circuit in the signal path 110. An example of a clock circuit that may be used for the clock circuit 120 is a delay-locked loop (DLL). Other clock circuits may be used as well.

The forward path measurement circuit 130 is configured to measure a forward path delay for the signal path 110. The forward path delay of the signal path 110 is the propagation delay of the signal path 110. A minimum forward path delay results from the inherent propagation delays of circuits in the signal path 110, and without any additional delay that may be added. As previously discussed, additional delay may be added to adjust the timing of a signal propagating through the signal path 110, as well as to provide the signal path 110 with a propagation delay to satisfy CL. The forward path measurement circuit 130 provides a count CNT of clock cycles that is representative of the forward path delay of the signal path 110. In some embodiments, for example, the embodiment of FIG. 1, the CNT count provided by the forward path measurement circuit 130 is based on signals from the clock circuit 120. The CNT count may be stored after determination for later use. The CNT count may be stored by the forward path measurement circuit 130, or by other circuitry.

In operation, the forward path measurement circuit 130 provides a CNT count based at least in part on signals from the clock circuit 120. For example, in the embodiment illustrated in FIG. 1 the forward path measurement circuit 130 is provided REF and FB signals on which the CNT count is based at least in part. The CNT count is provided to the signal path 110, which is further provided the DELADJ signal and the CLKOUT signal from the clock circuit 120. The signal path 110 is further provided a CL signal representative of the CAS latency. A shift circuit included in the signal path 110 is set to provide additional delay (if needed) based on the CL and CNT count. As a result of the additional delay, a CMDIN signal will be provided by the signal path 110 as the CMDOUT signal after a propagation delay to satisfy the CL.

Figure 2:
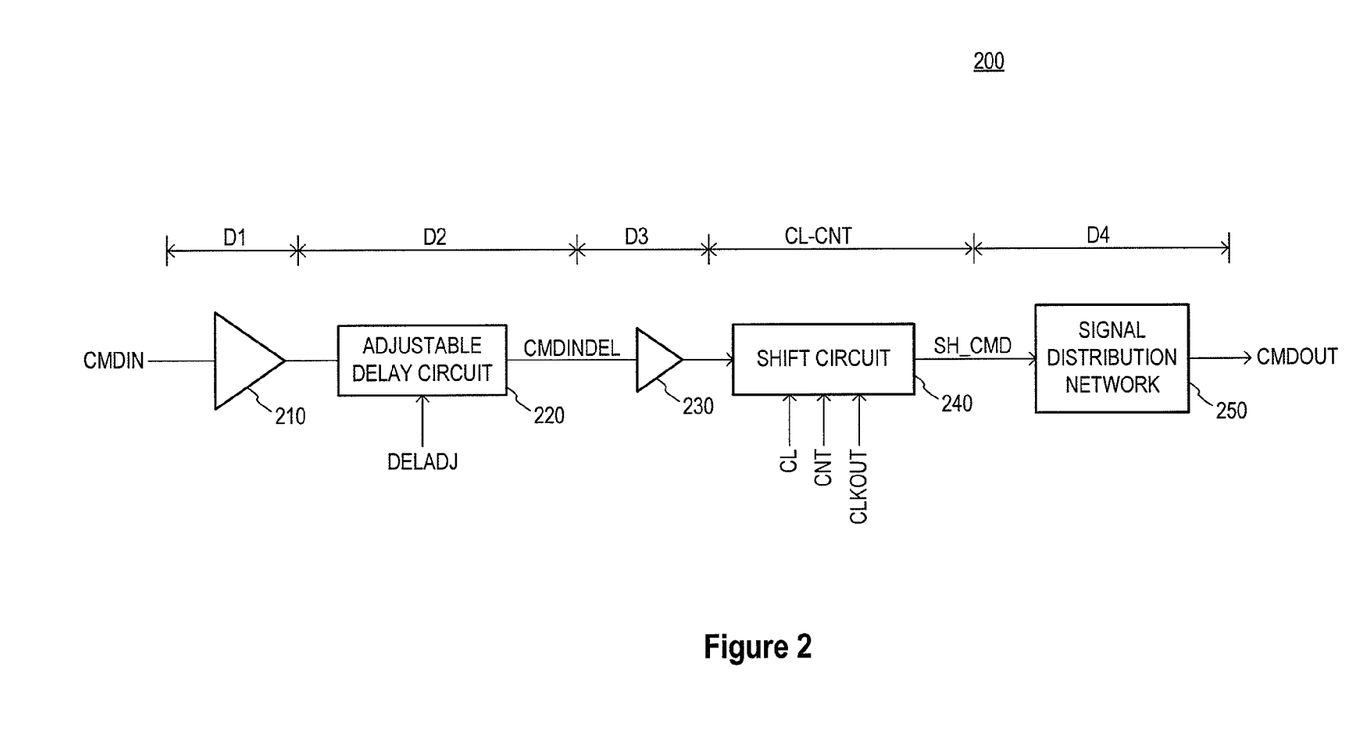
FIG. 2 is a block diagram of a signal path according to an embodiment of the invention.

FIG. 2 illustrates a signal path 200 according to an embodiment of the invention. The signal path 200 may be used for the signal path 110 of the embodiment of FIG. 1. The signal path 200 includes a buffer 210 configured to buffer an input signal, for example, a command signal CMDIN, and provide the buffered CMDIN signal to an adjustable delay circuit 220. The adjustable delay circuit 220 provides a delayed CMDIN signal CMDINDEL having a delay relative to the buffered CMDIN signal that is based on a delay adjustment signal DELADJ. The CMDINDEL signal is provided to a buffer 230 configured to buffer the CMDINDEL signal and provide the buffered CMDINDEL signal to a shift circuit 240.

The shift circuit 240 is provided a CL signal representative of a CAS latency, a signal representative of a CNT count, and a CLKOUT signal, which may be an output clock signal CLKOUT that clocks the shift circuit 240. The CNT count may be provided by the forward path measurement circuit 130 (FIG. 1) and the CLKOUT signal may be provided by the clock circuit 120. The shift circuit 240 is configured to shift commands represented by the buffered CMDINDEL signal N clock cycles of the CLKOUT signal before providing the shifted command as represented by a shifted command signal SH_CMD to a signal distribution network 250. The signal distribution network 250 distributes the SH_CMD signal to various circuits that may rely on the SH_CMD to operate.

The signal path 200 has a forward path delay that includes inherent propagation delays of the buffer 210, buffer 230, and the signal distribution network 250. In determining a minimum forward path delay, the minimum delay of the adjustable delay circuit 220 is also considered, that is, the least amount of delay provided by the adjustable delay circuit 220. As previously discussed, the signal path 200 should have a propagation delay to satisfy the CAS latency CL, and the CNT count represents the estimated forward path delay of the signal path 200 in terms of clock cycles. The value N is calculated as CL-CNT, which is the difference between a desired CAS latency (CL) and a forward path delay in number of clock cycles (CNT). By shifting commands by N clock cycles, the shift circuit 240 effectively adds N clock cycles to the minimum forward path delay of the signal path 200 so that the propagation delay of the signal path 200 satisfies the CL.

As illustrated in FIG. 2, the delay through buffer 210, adjustable delay circuit 220 (at minimum delay), and buffer 230 is D1+D2+D3. The delay through the shift circuit 240 is CL-CNT, and the delay through the signal distribution network is D4. The resulting minimum forward path delay of the signal path 200 is D1+D2+D3+D4 (i.e., propagation delay of the signal path 200 without delay of the shift circuit 240).

In operation, a command represented by the CMDIN signal is provided to the signal path 200 and propagated through the buffer 210, adjustable delay circuit 220 and buffer 230 to the shift circuit 240. The shift circuit 240 adds CL-CNT clock cycles (of the CLKOUT signal) to the propagating CMDIN signal before being provided to the signal distribution network 250 and output as the CMDOUT signal. With the additional clock cycles provided by the shift circuit 240 the resulting propagation delay of the signal path 200 will satisfy the CAS latency CL.

Figure 3:
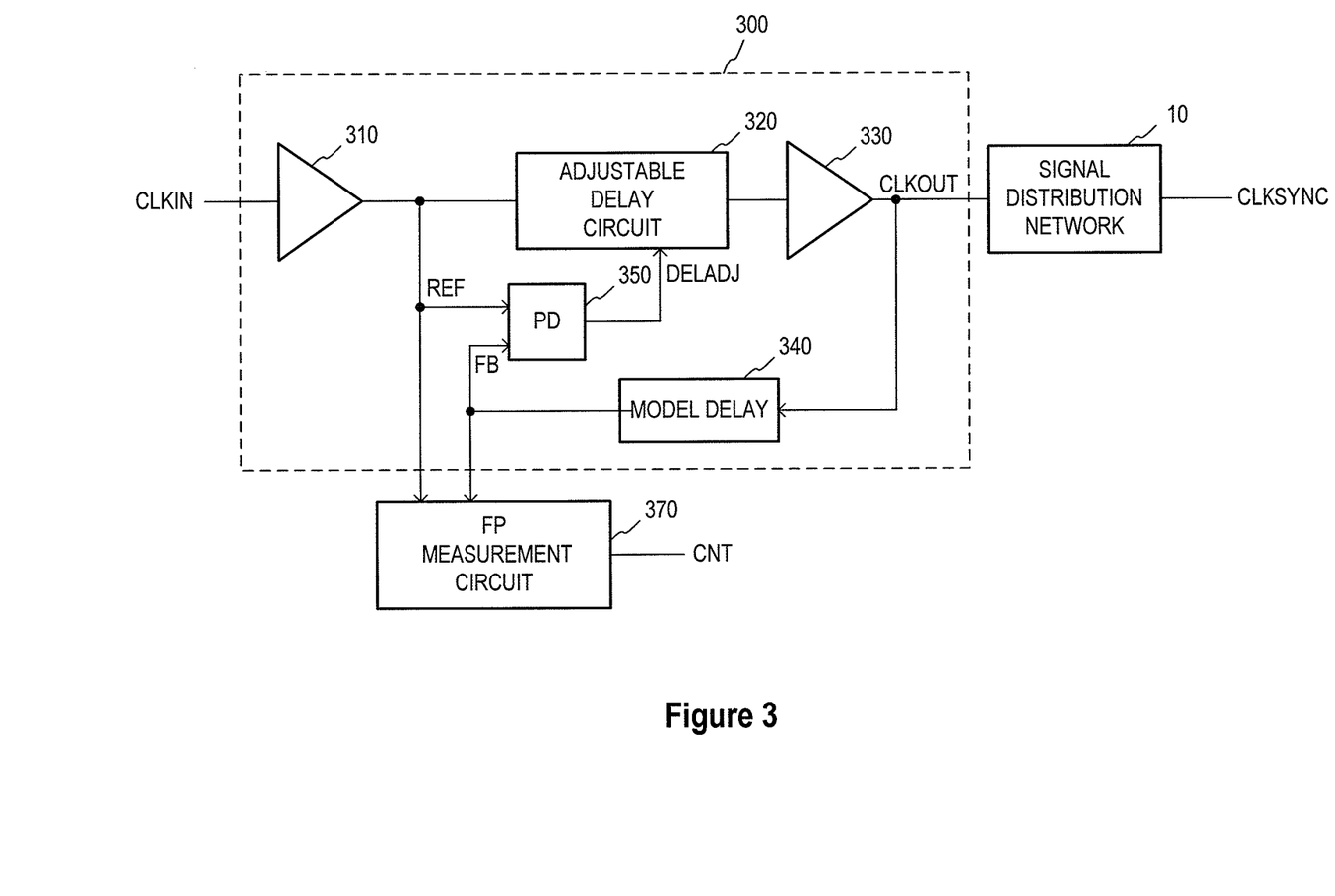
FIG. 3 is block diagram of a clock circuit and forward path measurement circuit according to an embodiment of an invention.

FIG. 3 illustrates a clock circuit 300 and forward path measurement circuit 370 according to an embodiment of an invention. The clock circuit 300 may be used for the clock circuit 120 (FIG. 1) and the forward path measurement circuit 370 may be used for the forward path measurement circuit 130. The clock circuit 300 is illustrated in FIG. 3 as a delay-locked loop and provides an output clock signal CLKOUT to a signal distribution network 10. The clock circuit 300 includes a buffer 310 configured to buffer an input clock signal CLKIN and provide a buffered clock signal REF to an adjustable delay circuit 320. The adjustable delay circuit 320 provides a delay to the buffered CLKIN signal based on a delay adjustment signal DELADJ. The delayed buffered CLKIN signal is provided to buffer 330, which is configured to buffer the signal from the adjustable delay circuit 320 and provide an output clock signal CLKOUT. The CLKOUT signal is provided to the signal distribution network 10 to be distributed to circuits as a CLKSYNC signal that may need the CLKSYNC signal to operate.

The CLKOUT signal is further provided to a model delay 340 that is configured to provide a delay that models an inherent propagation delay of the buffer 310 and the signal distribution network 10. A feedback signal FB having a delay relative to the CLKOUT signal as provided by the delay of the model delay 340, is provided to a phase detector 350. The phase detector 350 is also provided the REF signal. The phase detector 350 is configured to provide the DELADJ signal based at least in part on a phase difference between the REF and FB signals. The adjustable delay circuit is adjusted by the DELADJ signal until the REF signal and FB signal are in phase. When the REF and FB signals are in phase, the resulting CLKSYNC signal is in phase with the CLKIN signal.

The forward path measurement circuit 370 measures a propagation delay of a forward path of the clock circuit 300. The forward path of the clock circuit 300 is generally represented by the minimum propagation delay of the CLKIN signal to the CLKSYNC signal. In the embodiment of FIG. 3, the forward path of the clock circuit 300 includes propagation delays of buffer 310, buffer 330, the signal distribution network 10, and a minimum delay of the adjustable delay circuit 320.

In the embodiment of FIG. 3, the forward path measurement circuit 370 measures a propagation delay that represents a forward path delay of a signal path, for example, signal path 110 (FIG. 1) or signal path 200 (FIG. 2). As previously discussed with reference to FIG. 2, the minimum forward path delay of the signal path 200 is represented by the inherent propagation delays of the buffer 210, buffer 230, the signal distribution network 250, and a minimum delay of the adjustable delay circuit 220. In a specific example, where the buffer 310, the adjustable delay 320, and buffer 330 have a same propagation delay as the buffer 210, adjustable delay circuit 220, and buffer 230, respectively, and the signal distribution network 10 has the same propagation delay as the signal distribution network 250, the minimum forward path delay of the clock circuit 300 will be representative of the minimum forward path delay of the signal path 200. Thus, measuring the minimum forward path delay of the clock circuit 300 will result in a measurement for the minimum forward path delay of the signal path 200.

In some embodiments, the forward path measurement circuit 370 measures the forward path delay by measuring a delay between the REF signal and the FB signal and calculating a resulting number of clock cycles of the CLKIN signal. The delay between the REF signal and the FB signal represents the delay of the forward path of the clock circuit 300. As previously discussed, the FB signal is delayed relative to the REF signal by a delay provided by the adjustable delay circuit 320, the buffer 330, and the model delay 340. As also previously discussed, the model delay models inherent propagation delay of the buffer 310 and the signal distribution network 10. Thus, the sum delay between the REF signal and the FB signal may represent the propagation delay of the buffer 310, the adjustable delay circuit 320, buffer 330, and the signal distribution network 10 (the buffer 310 and signal distribution network delays represented by the model delay 340), which represents the forward path delay of the clock circuit 300. As a result, by measuring the delay between the REF and FB signals, and calculating a resulting number of clock cycles the forward path measurement circuit 370 measures the forward path delay of the clock circuit 300. As previously described, the minimum forward path delay of the clock circuit 300 may represent the minimum forward path delay of a signal path 200 in FIG. 2 that includes circuitry having the same propagation delays as the clock circuit 300.

In some embodiments, the adjustable delay circuit 320 and an adjustable delay of a signal path, for example, adjustable delay circuit 220 of the signal path 200 (FIG. 2) are adjusted to provide a same adjustable delay based at least in part on the DELADJ signal. For example, an adjustable delay circuit in a signal path may exhibit the same adjustable delay characteristics as the adjustable delay circuit 320, and consequently, may also be adjusted by the DELADJ signal. Such is the case when the adjustable delay circuit of the signal path is a "match" of the clock circuit. By providing the same adjustable delay for the clock circuit and the signal path, the change to the forward path delay of the clock circuit 300 due to the adjustable delay added by the adjustable delay circuit 320, will change the forward path delay of the signal path 200 in a likewise manner.

Figure 4:
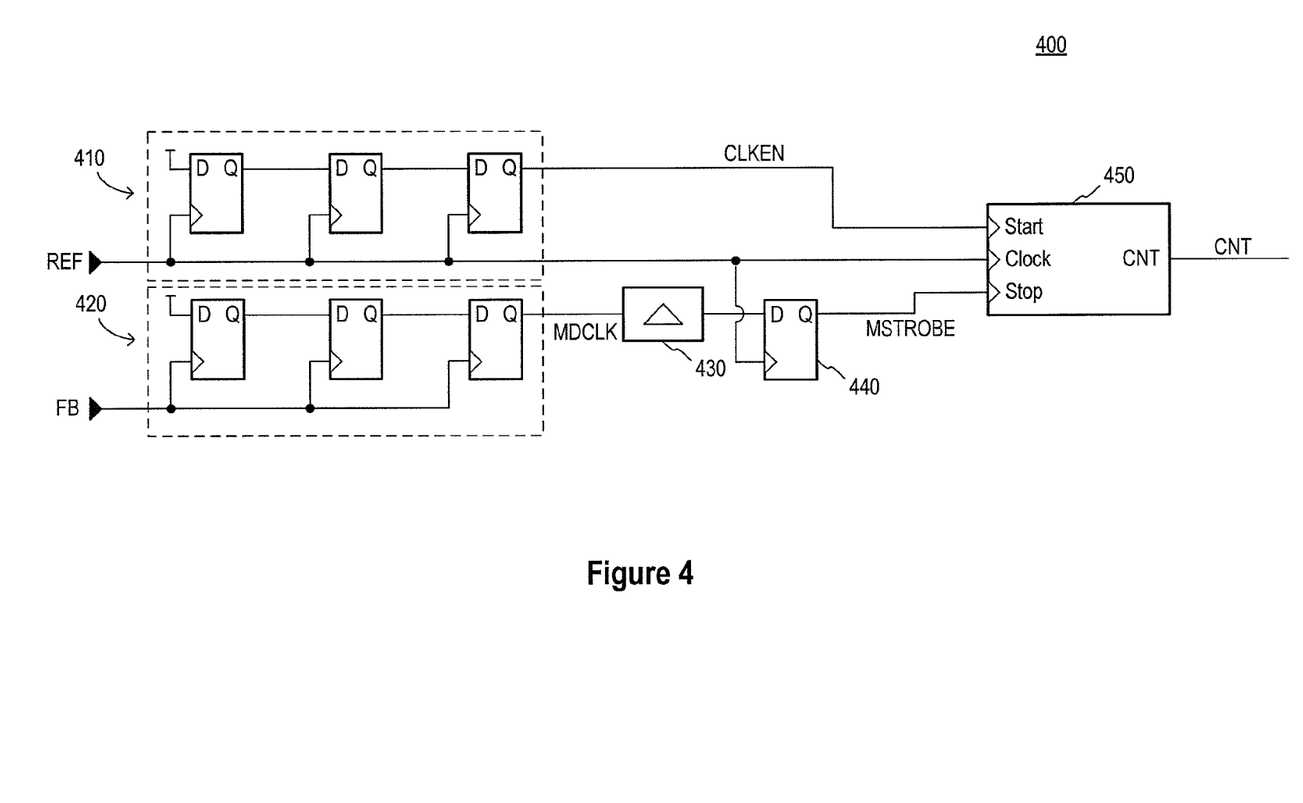
FIG. 4 is a block diagram of a forward path measurement circuit according to an embodiment of the invention.

FIG. 4 illustrates a forward path measurement circuit 400 according to an embodiment of the invention. The forward path measurement circuit 400 is configured to measure a forward path delay of a clock circuit in terms of a number of clock cycles of a clock signal. The forward path measurement circuit 400 may be used for the forward path measurement circuit 370 (FIG. 3).

The forward path measurement circuit 400 includes a first series of data flip flops 410 configured to receive a first clock signal (e.g., a reference clock signal REF as illustrated in FIG. 4) and provide a clock enable signal CLKEN. The CLKEN signal is provided to a counter 450 as a start input. The REF signal further clocks the counter 450. The forward path measurement circuit 400 further includes a second series of data flip flops 420 configured to receive a second clock signal (e.g., a feedback clock signal FB as illustrated in FIG. 4) and provide a measurement delay clock signal MDCLK. The MDCLK signal is provided to a delay element 430. The delay element 430 provides a fixed minimum delay to allow a clock circuit to which the forward path measurement circuit 400 is coupled to operate over a wide range of conditions. The amount of delay provided by the delay element 430 may vary depending on the particular implementation. The delay element 430 is coupled to a data flip flop 440 that is clocked by the REF signal to generate a measurement pulse signal MSTROBE. The MSTROBE signal is provided to the counter 450 as a stop input.

In operation, when an input clock signal to a clock circuit begins to transition, the REF signal clocks the first series of data flip flops 410. At a later point in time, the REF signal propagates through a feedback path of the clock circuit and the rising edges are seen in the FB signal, which clocks the second series of data flip flops 420. Following the third clock pulse (due to there being three flip flops in the first series of data flip flops 410), the CLKEN signal is asserted, and the counter 450 begins counting each pulse of the REF signal. The FB signal clocks second series of data flip flops 420, and after the third pulse, the MDCLK signal is asserted. The MDCLK signal passes through the delay element 430 and is latched in the data flip flop 440 following the next rising edge of the REF signal, thus generating the MSTROBE signal. The MSTRBE signal stops the counter 450. The start and stop signals provided to the counter 450 are synchronized with the rising edge of the REF signal. The value of the counter 450, CNT, represents the number of clock signals required for the REF signal to propagate through the forward path of the clock circuit. In some embodiments, the CNT value is maintained in the counter 450 and stored and referenced when needed.

In the embodiment illustrated in FIG. 4, three data flip flops are included in the first and second series of data flip flops 410, 420 to allow the forward path to be populated with clock signals and stabilize. In other embodiments, however, the number of flip flops in the series of data flip flops 410, 420 may vary depending on the particular implementation.

Figure 5:
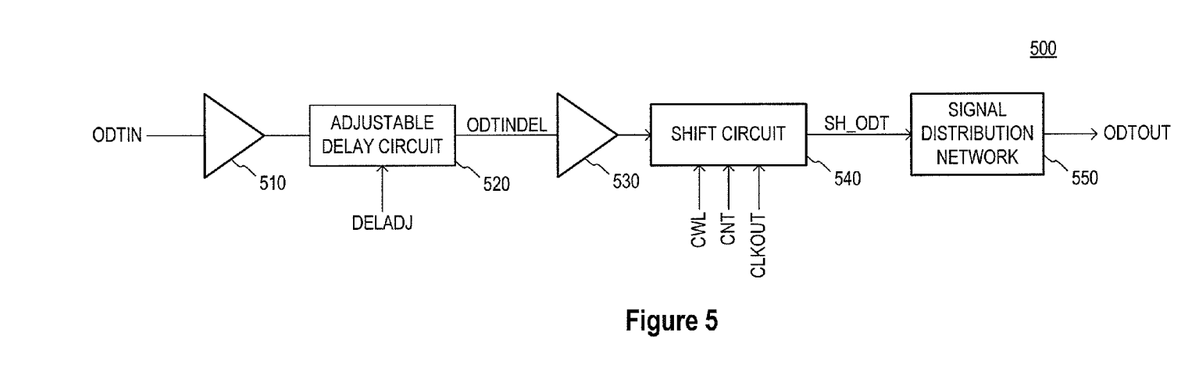
FIG. 5 is a block diagram of a signal path according to an embodiment of the invention.

FIG. 5 illustrates a signal path 500 according to an embodiment of the invention. The signal path 500 may be used for the signal path 110 of the embodiment of FIG. 1. The signal path is illustrated in FIG. 5 as providing an on-die termination command ODTIN as an ODTOUT signal at a time that satisfy a CAS write latency CWL. The signal path 500 includes a buffer 510 configured to buffer the ODTIN signal and provide the buffered ODTIN signal to an adjustable delay circuit 520. The adjustable delay circuit 520 provides a delayed ODTIN signal ODTINDEL having a delay relative to the buffered ODTIN signal that is based on a delay adjustment signal DELADJ. The ODTINDEL signal is provided to a buffer 530 configured to buffer the ODTINDEL signal and provide the buffered ODTINDEL signal to a shift circuit 540.

The shift circuit 540 is further provided a CWL signal representative of a CAS write latency, a signal representative of a CNT count, and a CLKOUT signal, which may be an output clock signal CLKOUT that clocks the shift circuit 540. The CNT count may be provided by a forward path measurement circuit, for example, forward path measurement circuit 130 (FIG. 1). As previously discussed, the CNT count may represent the estimated forward path delay of the signal path in terms of clock cycles. The CLKOUT signal may be provided by a clock circuit, for example, clock circuit 120. The shift circuit 540 is configured to shift the ODT command represented by the buffered ODTINDEL signal N clock cycles of the CLKOUT signal before providing the shifted command signal SH_ODT to a signal distribution network 550. The signal distribution network 550 distributes the SH_ODT signal to various circuits that may rely on the SH_ODT to operate, for example, on-die termination circuits used during write operations.

The signal path 500 has a forward path delay that includes inherent propagation delays of the buffer 510, buffer 530, and the signal distribution network 550. The signal path 500 should have a propagation delay to satisfy the CAS write latency CWL. By shifting the ODT command by N clock cycles, the shift circuit 540 effectively adds N clock cycles to the minimum forward path delay of the signal path 500 so that the propagation delay of the signal path 500 satisfies the CWL. In the embodiment of FIG. 5, the value N is calculated as CWL-CNT, which is the difference between a desired CAS write latency (CWL) and a forward path delay in number of clock cycles (CNT).

In operation, an ODT command represented by the ODTIN signal is provided to the signal path 500 and propagated through the buffer 510, adjustable delay circuit 520 and buffer 530 to the shift circuit 540. The shift circuit 540 adds CWL-CNT clock cycles (of the CLKOUT signal) to the propagating ODTIN signal before being provided to the signal distribution network 550 and output as the ODTOUT signal. With the additional clock cycles provided by the shift circuit the resulting propagation delay of the signal path 500 will satisfy the CAS write latency CWL. In some embodiments, the shift circuit 540 shifts the ODT command by more or less than CWL-CNT, for example, where an ODT preamble is used with the ODTOUT signal.

Figure 6:
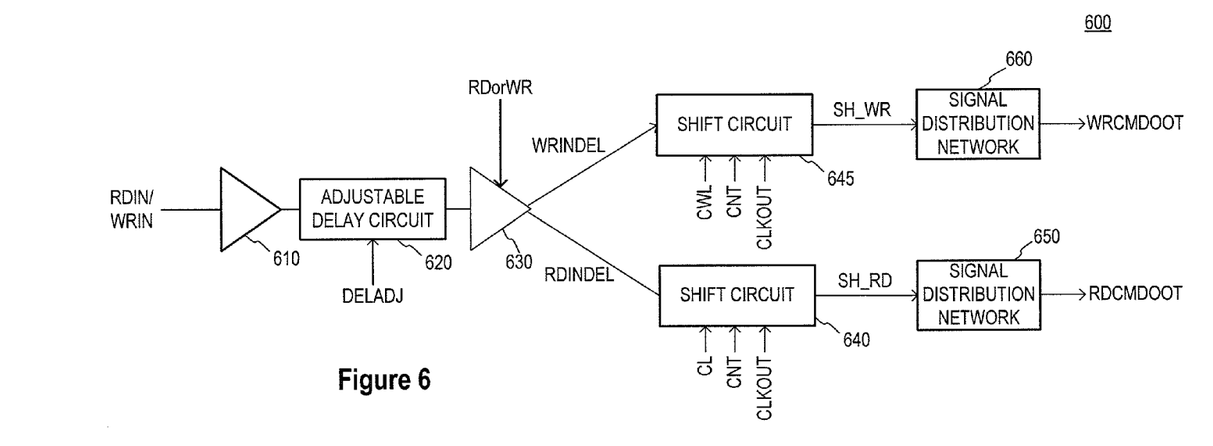
FIG. 6 is a block diagram of a signal path according to an embodiment of the invention.

FIG. 6 illustrates a signal path 600 according to an embodiment of the invention. The signal path 600 may be used for the signal path 110 of the embodiment of FIG. 1. The signal path is illustrated in FIG. 6 as providing read and write commands RDIN, WRIN as a CMDOUT signal at a time that satisfy a CAS latency CL and CAS write latency CWL. The signal path 600 includes a buffer 610 configured to buffer the RDIN, WRIN signal and provide the buffered RDIN, WRIN signal to an adjustable delay circuit 620. The adjustable delay circuit 620 provides a delayed RDIN, WRIN signal RDINDEL, WRINDEL having a delay relative to the buffered RDIN, WRIN signal that is based on a delay adjustment signal DELADJ. The RDINDEL, WRINDEL signal is provided to a de-multiplexer 630 configured to provide RDINDEL signals to a shift circuit 640 and provide WRINDEL signals to a shift circuit 645, as controlled by a read or write signal RDorWR.

The shift circuit 640 is provided a CL signal representative of a CAS latency, a signal representative of a CNT count, and a CLKOUT signal that clocks the shift circuit 640. The shift circuit 645 is provided a CWL signal representative of a CAS write latency, the CNT count, and the CLKOUT signal that clocks the shift circuit 645. The CNT count may be provided by a forward path measurement circuit, for example, forward path measurement circuit 130 (FIG. 1). As previously discussed, the CNT count may represent the estimated forward path delay of the signal path in terms of clock cycles. The CLKOUT signal may be provided by a clock circuit, for example, clock circuit 120.

The shift circuit 640 is configured to shift a read command represented by the RDINDEL signal N1 clock cycles of the CLKOUT signal before providing the shifted read command signal SH_RD to a signal distribution network 650. The signal distribution network 650 distributes the SH_RD signal as a read command signal RDCMDOUT. The shift circuit 645 is configured to shift a write command represented by the WRINDEL signal N2 clock cycles of the CLKOUT signal before providing the shifted write command signal SH_WR to a signal distribution network 660. The signal distribution network 660 distributes the SH_WR signal as a write command signal WRCMDOUT. The RDCMDOUT and WRCMDOUT signals are distributed to various circuits that may rely on the SH_RD, SH_WR signal to operate, for example, an read data driver or a write data driver.

The signal path 600 has a forward path delay that includes inherent propagation delays of the buffer 610, de-multiplexer 630, and the signal distribution network 650, 660. The signal path 600 should have a propagation delay to satisfy the CAS latency CL and CAS write latency CWL. By shifting the read command by N1 clock cycles, the shift circuit 640 effectively adds N1 clock cycles to the minimum forward path delay of the signal path 600 so that the propagation delay of the signal path 600 satisfies the CL. In the embodiment of FIG. 6, the value N1 is calculated as CL-CNT, which is the difference between a desired CAS latency (CL) and a forward path delay in number of clock cycles (CNT). By shifting the read command by N2 clock cycles, the shift circuit 645 effectively adds N2 clock cycles to the minimum forward path delay of the signal path 600 so that the propagation delay of the signal path 600 satisfies the CWL. In the embodiment of FIG. 6, the value N2 is calculated as CWL-CNT, which is the difference between a desired CAS write latency (CWL) and a forward path delay in number of clock cycles (CNT).

In operation, a read command represented by the RDIN signal or a write command represented by the WRIN signal, is provided to the signal path 600 and propagated through the buffer 610 and adjustable delay circuit 620. Based at least in part on the RDorWR signal, read commands are provided through the de-multiplexer 630 to the shift circuit 640 and write commands are provided through the de-multiplexer 630 to the shift circuit 645. The shift circuit 640 adds CL-CNT clock cycles (of the CLKOUT signal) to a propagating read command signal before being provided to the signal distribution network 650 and output as the RDCMDOUT signal. With the additional clock cycles provided by the shift circuit 640 the resulting propagation delay of the signal path 600 will satisfy the CAS latency CL. The shift circuit 645 adds CWL-CNT clock cycles (of the CLKOUT signal) to a propagating write command signal before being provided to the signal distribution network 660 and output as the WRCMDOUT signal. With the additional clock cycles provided by the shift circuit 645 the resulting propagation delay of the signal path 600 will satisfy the CAS write latency CWL. The shift circuits 640 and 645 may shift the respective command by more or less than CL-CNT and CWL-CNT, for example, where read and write command preambles are used with the RDCMDOUT and WRCMDOUT signals.

In some embodiments, the adjustable delay circuit 520 may be matched to an adjustable delay of a clock circuit providing the CLKOUT signal to the signal path 500. In this manner, an DELADJ signal provided by the clock circuit may be used to adjust the adjustable delay of the adjustable delay circuit 520 to provide the same adjustable delay. As a result, the forward path delay of the signal path 300 may be changed in a likewise manner as a forward path delay of the clock circuit due to the adjustable delay added by its adjustable delay circuit. The adjustable delay circuit 620 may also be matched to an adjustable delay of a clock circuit as well.

In some embodiments, a plurality of signal paths are included in an apparatus. For example, a first signal path, such as signal path 500, and a second signal path, such as signal path 600 may be included together. The signal paths 500 and 600 may be configured to have respective adjustable delay lines that are matched to an adjustable delay line of a clock circuit providing both signal paths a CLKOUT signal. Other signal paths may be alternatively, or additionally included in other apparatuses.

Figure 7:
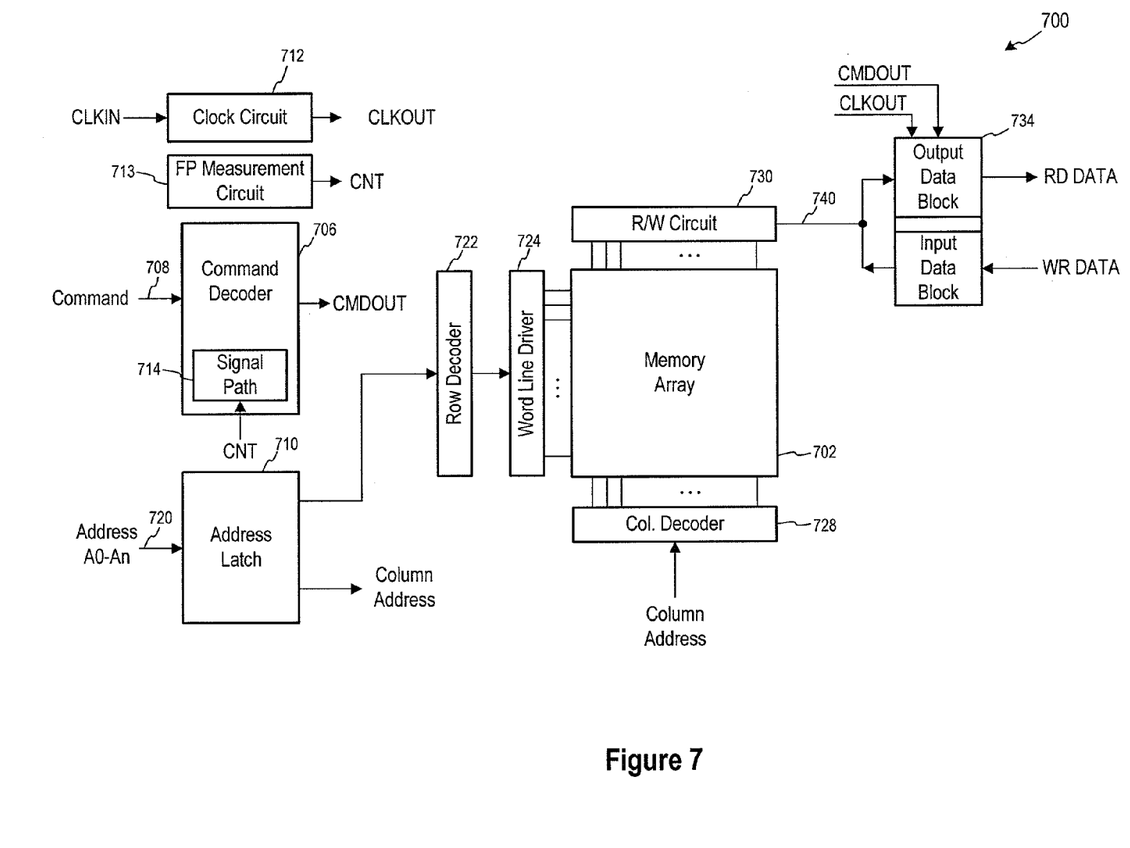
FIG. 7 is a block diagram of a memory according to an embodiment of the invention.

FIG. 7 illustrates a portion of a memory 700 according to an embodiment of the present invention. The memory 700 includes an array 702 of memory cells, which may be, for example, DRAM memory cells, SRAM memory cells, flash memory cells, or some other types of memory cells. The memory 700 includes a command decoder 706 that receives memory commands through a command bus 708 and provides (e.g. generates) corresponding control signals within the memory 700 to carry out various memory operations. Row and column address signals are provided (e.g., applied) to the memory 700 through an address bus 720 and provided to an address latch 710. The address latch then outputs a separate column address and a separate row address.

The row and column addresses are provided by the address latch 710 to a row address decoder 722 and a column address decoder 728, respectively. The column address decoder 728 selects bit lines extending through the array 702 corresponding to respective column addresses. The row address decoder 722 is connected to word line driver 724 that activates respective rows of memory cells in the array 702 corresponding to received row addresses. The selected data line (e.g., a bit line or bit lines) corresponding to a received column address are coupled to a read/write circuitry 730 to provide read data to an input/output data block 734 via an input-output data bus 740. Write data are provided to the memory array 702 through the I/O data block 734 and the memory array read/write circuitry 730. The I/O data block 734 may include clocked circuitry that operate responsive to an internal clock signal CLKOUT and an internal command signal CMDOUT, for example.

The memory 70Q further includes clock circuit 712, forward path measurement circuit 713, and signal path 714. The clock circuit 712 receives a input clock signal CLKIN and propagates the internal clock signal CLKOUT which is based at least in part on the CLKIN signal to the I/O data block 734. The forward path measurement circuit 713 measures a forward path delay in number of clock cycles of the CLKOUT signal and provides a count CNT to the signal path 714. The clock circuit 712, forward path measurement circuit 713, and signal path 714 may be implemented using embodiments of the invention. The signal path 714, which is shown in FIG. 7 as being included in the command decoder 706, but is not limited to such a configuration, provides the internal command signal CMDOUT to the I/O data block 734. The command decoder 706 responds to memory commands provided to the command bus 708 to perform various operations on the memory array 702. In particular, the command decoder 706 is used to provide internal control signals to read data from and write data to the memory array 702.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. An apparatus, comprising:
   a signal path including a first adjustable delay circuit and further including a shift circuit, wherein the shift circuit is configured to add a number of clock cycles of a clock signal to a forward path delay of the signal path, the number of clock cycles based at least in part on a count value;
   a clock circuit configured to provide to the signal path as the clock signal an output clock signal having a delay relative to an input clock signal, wherein the clock circuit includes a second adjustable delay circuit matched to the first adjustable delay and the clock circuit having a forward path delay representative of the forward path delay of the signal path; and
   a forward path measurement circuit coupled to the clock circuit and configured to count clock cycles of the output clock signal representative of the forward path delay of the clock circuit and provide the count to the signal path as the count value.

2. The apparatus of claim 1, further comprising a count memory configured to store the count value.

3. The apparatus of claim 1 wherein the clock circuit comprises a phase detector configured to compare a reference clock signal and a feedback clock signal and provide a phase signal indicative of a phase difference between the reference and feedback clock signals, wherein the reference clock signal is based at least in part on the input clock signal and the feedback clock signal is based at least in part on the output clock signal.

4. The apparatus of claim 3 wherein the clock circuit is configured to provide the phase signal to the first and second adjustable delay circuits.

5. The apparatus of claim 3 wherein the forward path measurement circuit is configured to count clock cycles of the output clock signal based at least in part on the reference clock signal and the feedback clock signal.

6. The apparatus of claim 1 wherein the signal path comprises a command signal path, and the apparatus further comprises:
   an on-die termination command signal path having a third adjustable delay circuit.

7. The apparatus of claim 6 wherein the clock circuit comprises a phase detector configured to compare a reference clock signal and a feedback clock signal and provide a phase signal indicative of a phase difference between the reference and feedback clock signals, the reference clock signal is based at least in part on the input clock signal and the feedback clock signal is based at least in part on the output clock signal, wherein the phase signal provided to the first, second, and third adjustable delay circuits.

8. The apparatus of claim 1 wherein the signal path further includes:
   first and second buffers coupled to the first adjustable delay circuit; and
   a signal distribution network.

9. The apparatus of claim 8 wherein the clock circuit includes a model delay having a delay that models inherent propagation delays of the first buffer and the signal distribution network.

10. The apparatus of claim 1 wherein the shift circuit is configured to add a number of clock cycles of the clock signal based on the difference between a CAS latency and the count value.

11. The apparatus of claim 1 wherein the signal path comprises a command signal path configured to propagate a command signal.

12. An apparatus, comprising:
a signal path including first and second shift circuits, wherein each shift circuit is configured to add a respective number of clock cycles to a forward path delay of the signal path;
a clock circuit coupled to the signal path and configured to provide an output clock signal to clock the first and second shift circuits, wherein the clock circuit has a forward path delay representative of the forward path delay of the signal path; and
a forward path measurement circuit coupled to the clock circuit and configured to measure the forward path delay in terms of clock cycles of the output clock signal and provide a count representative of the forward path delay to the first and second shift circuits.

13. The apparatus of claim 12 wherein the clock circuit comprises a delay-locked loop.

14. The apparatus of claim 12 wherein the forward path measurement circuit comprises:
a first series of data flip-flops configured to receive a reference clock signal and provide an output reference clock signal;
a second series of data flip-flops configured to receive a feedback clock signal and provide an output feedback clock signal; and
a counter coupled to the first and second series of data flip-flops and configured to count a number of clock signals responsive to the output reference clock signal and the output feedback clock signal.

15. The apparatus of claim 12 wherein the clock circuit further includes:
first and second buffers coupled to the second adjustable delay; and
a model delay configured to provide a model delay,
wherein the forward path delay includes propagation delays of the first and second buffers, the model delay, and a minimum delay of the second adjustable delay circuit.

16. The apparatus of claim 12 wherein the signal path comprises a command signal path configured to propagate read and write command signals.

17. The apparatus of claim 16 wherein the signal path further includes:
a first buffer;
an adjustable delay circuit coupled to the first buffer;
a de-multiplexer coupled to the adjustable delay circuit and configured to provide read command signals to the first shift circuit and write command signals to the second shift circuit.

18. The apparatus of claim 17 wherein the first shift circuit is configured to add a number of clock cycles of the clock signal based on the difference between a CAS latency and the count value and wherein the second shift circuit is configured to add a number of clock cycles of the clock signal based on the difference between a CAS write latency and the count value.

19. A method, comprising:
calculating a forward path delay of a clock circuit in terms of a number of clock cycles of an output clock signal provided by the clock circuit; and
adding a number of additional clock cycles of delay to a forward path delay of a signal path, wherein the forward path delay of the clock circuit is representative of the forward path delay of the signal path and the number of additional clock cycles is based at least in part on the number of clock cycles of forward path delay.

20. The method of claim 19 wherein calculating a forward path delay of a clock circuit comprises:
counting a number of clock signals for a reference clock signal to propagate through a forward path of the clock circuit.

21. The method of claim 19 wherein the number of additional clock cycles of delay added to a forward path is based at least in part on a difference between a CAS latency and the number of clock signals of forward path delay of the clock circuit.

22. The method of claim 19 further comprising:
adjusting an adjustable delay of the signal path to provide a delay substantially equal to a delay of an adjustable delay of the clock circuit.

23. The method of claim 19, further comprising:
propagating a write command through a first portion of the signal path and propagating the write command through a second portion of the signal path; and
propagating a read command through the first portion of the signal path and propagating the read command through a third portion of the signal path, wherein a first number of additional clock cycles is added to the second portion of the signal path and a second number of additional clock cycles is added to the third portion of the signal path, the first and second number of additional clock cycles different.

24. A method, comprising:
counting a number of clock cycles of propagation delay for a forward path delay of a clock circuit; and
adding to a forward path delay of a signal path a number of clock signals, wherein the number of clock signals is based at least in part on a difference between a CAS latency and the number of clock cycles of propagation delay for the forward path delay of the clock circuit.

25. The method of claim 24 wherein counting a number of clock cycles of propagation delay for a forward path delay of a clock circuit comprises:
measuring a delay between a reference clock signal and a feedback clock signal of the clock circuit in terms of clock cycles.

26. The method of claim 24 wherein counting a number of clock cycles of propagation delay for a forward path delay of a clock circuit comprises:
starting a counter with a start signal based on a reference clock signal of the clock circuit; and
stopping the counter with a stop signal based on a feedback clock signal of the clock circuit.

27. The method of claim 26, further comprising storing in the counter the number of clock cycles of propagation delay.

* * * * *